(12) United States Patent
Iwai et al.

(10) Patent No.: US 8,030,728 B2
(45) Date of Patent: Oct. 4, 2011

(54) OPTICAL SEMICONDUCTOR DEVICE

(75) Inventors: Takaki Iwai, Osaka (JP); Hironari Takehara, Kyoto (JP); Hisatada Yasukawa, Kyoto (JP)

(73) Assignee: Panasonic Corporation, Osaka (JP)

( * ) Notice: Subject to any disclaimer, the term of this patent is extended or adjusted under 35 U.S.C. 154(b) by 268 days.

(21) Appl. No.: 12/397,765

(22) Filed: Mar. 4, 2009

(65) Prior Publication Data

US 2009/0230498 A1  Sep. 17, 2009

(30) Foreign Application Priority Data

Mar. 12, 2008  (JP) .................................. 2008-062068

(51) Int. Cl.
*H01L 31/00* (2006.01)
(52) U.S. Cl. ........... 257/459; 257/443; 257/432; 438/70
(58) Field of Classification Search .................. 257/459, 257/443, 431, E31.032, 294, 291, 461; 438/70
See application file for complete search history.

(56) References Cited

U.S. PATENT DOCUMENTS

| 5,567,974 A | 10/1996 | Yoshitake et al. |
| 6,049,118 A | 4/2000 | Nagano |
| 7,345,703 B2 | 3/2008 | Lee |
| 2006/0145223 A1* | 7/2006 | Ryu .............................. 257/294 |

FOREIGN PATENT DOCUMENTS

| JP | 63-160270 A | 7/1988 |
| JP | 07-131054 | 5/1995 |
| JP | 09-186307 | 7/1997 |
| JP | 2005-129701 | 5/2005 |
| JP | 2006-190857 | 7/2006 |

* cited by examiner

*Primary Examiner* — Michael Shingleton
(74) *Attorney, Agent, or Firm* — McDermott Will & Emery LLP

(57) ABSTRACT

An optical semiconductor device includes a semiconductor substrate; a light receiving element formed on the semiconductor substrate; a light absorbing element formed on the semiconductor substrate and located adjacent to the light receiving element; and a semiconductor element formed on the semiconductor substrate and used for signal processing. The light absorbing element includes a fifth semiconductor layer, and a light absorption region in the light receiving element has a different structure from a light absorption region in the light absorbing element.

8 Claims, 8 Drawing Sheets

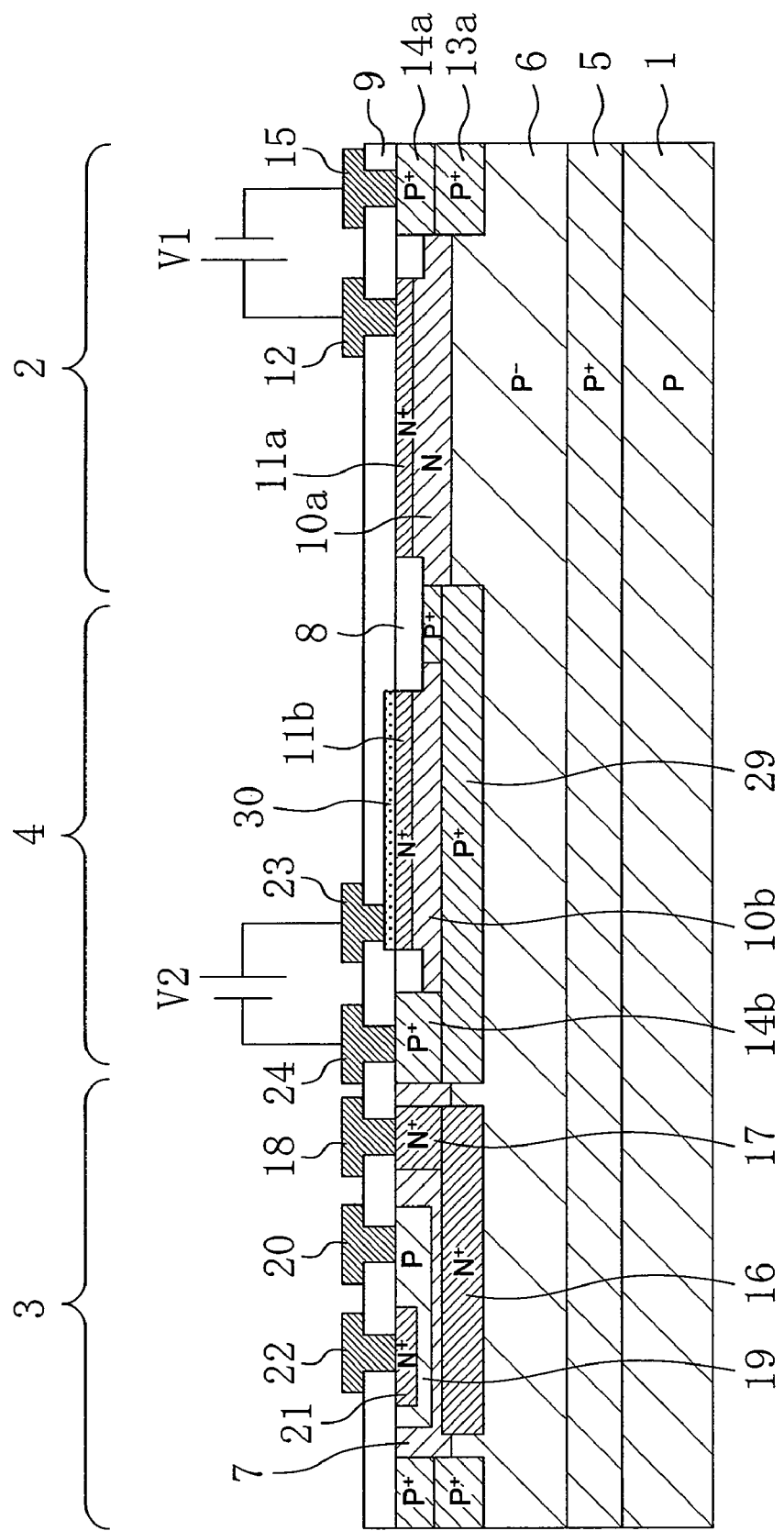

OPTICAL SEMICONDUCTOR DEVICE

CROSS-REFERENCE TO RELATED APPLICATION

This application claims priority from Japanese Patent Application JP2008-062068 filed on Mar. 12, 2008, the disclosure of which application is hereby incorporated by reference into this application in its entirety for all purposes.

BACKGROUND OF THE INVENTION

Light receiving elements, which are typical elements of optical semiconductor devices, convert an optical signal to an electrical signal and are used in various fields. In particular, in the field of optical discs, such as CDs (Compact Discs) and DVDs (Digital Versatile Discs), light receiving elements are important as key devices in optical pickup devices that read and write signals recorded on optical discs. In recent years, in response to the demand for higher performance and higher degree of integration, so-called optoelectronic integrated circuits (OEICs), in which a photodiode serving as a light receiving element and various electronic elements, such as a bipolar transistor, a resistor, and a capacitor, are integrated together on the same substrate, have been put to practical use. Also, optical discs are required to become faster and smaller and compatible with various kinds of discs. And in OEICs, it is required that a light receiving element having high light-receiving sensitivity, high speed and low noise characteristics and a bipolar transistor having high speed and low noise characteristics be integrated together. Recently, in particular, in accordance with the demand for an increase in the capacity of optical discs, the commercialization of HD-DVDs and Blu-ray Discs (BDs) that employ a blue semiconductor laser (having a wavelength of 405 nm) as a light source has begun, and hence there is a demand for OEICs that have high speed, high light-receiving sensitivity and low noise characteristics in the short wavelength region corresponding to the blue semiconductor laser.

An optical semiconductor device according to a first conventional example will be described below.

FIG. 7 is a cross-sectional view schematically illustrating the structure of the optical semiconductor device, which is an OEIC, according to the first conventional example. In FIG. 7, the optical semiconductor device in which a pin (p-intrinsic-n) photodiode as a light receiving element and an NPN transistor as a bipolar transistor are formed on a p-type silicon substrate is illustrated as an example.

As shown in FIG. 7, the optical semiconductor device of the first conventional example includes: a silicon substrate 101 containing a low concentration of a p-type impurity; an NPN transistor 103 formed on the silicon substrate 101; a photodiode 102 formed on the silicon substrate 101; and a light absorbing element 104 formed in a region on the silicon substrate 101 between the NPN transistor 103 and the photodiode 102. The conventional optical semiconductor device also includes: a first p-type buried layer 105 formed on the silicon substrate 101 and containing a high concentration of a p-type impurity; a p-type epitaxial layer 106 formed on the first p-type buried layer 105 and containing a low concentration of a p-type impurity; an n-type epitaxial layer 107 formed on the p-type epitaxial layer 106; a LOCOS (local oxidation of silicon) isolation layer 108 formed on the n-type epitaxial layer 107 and isolating the light absorbing element 104 and the photodiode 102 from each other; and an insulating film 109 formed on the n-type epitaxial layer 107 and on the LOCOS isolation layer 108.

The photodiode 102 includes: a part of the above-mentioned p-type epitaxial layer 106; a part of an n-type cathode layer 110 composed of a part of the n-type epitaxial layer 107; a part of a cathode contact layer 111 formed on the cathode layer 110 and containing a high concentration of an n-type impurity; an anode buried layer 113 containing a high concentration of a p-type impurity; an anode contact layer 114 formed on the anode buried layer 113 and containing a high concentration of a p-type impurity; a first cathode electrode 112 formed on the cathode contact layer 111; and a first anode electrode 115 formed on the anode contact layer 114.

The NPN transistor 103 includes: a collector buried layer 116 formed between the p-type epitaxial layer 106 and the n-type epitaxial layer 107 and containing a high concentration of an n-type impurity; a collector contact layer 117 formed on the collector buried layer 116 and containing a high concentration of an n-type impurity; a p-type base layer 119 formed in a region in the n-type epitaxial layer 107 located above the collector buried layer 116; an emitter layer 121 formed in the base layer 119 and containing a high concentration of an n-type impurity; a collector electrode 118 formed on the collector contact layer 117; a base electrode 120 formed on the base layer 119; and an emitter electrode 122 formed on the emitter layer 121.

The light absorbing element 104 includes: a part of the p-type epitaxial layer 106; a part of the cathode layer 110 formed on the p-type epitaxial layer 106; a part of the cathode contact layer 111 formed on the cathode layer 110; the p-type anode buried layer 113 formed on the p-type epitaxial layer 106; the p-type anode contact layer 114 formed on the anode buried layer 113; a second cathode electrode 123 formed on the cathode contact layer 111; and a second anode electrode 124 formed on the anode contact layer 114.

Operation of the conventional optical semiconductor device thus configured will be described below.

When there is incident light on the upper surface of the photodiode 102, the cathode layer 110, and the p-type epitaxial layer 106 which serves as the anode absorb the light, thereby generating electron-hole pairs. At this time, if a reverse bias V1 is applied to the photodiode 102, a depletion layer expands in the p-type epitaxial layer 106 having a low impurity concentration. The electrons and holes of electron-hole pairs generated in the vicinity of the depletion layer are separated from each other by diffusion and drift, so that the electrons reach the cathode contact layer 111, and the holes reach the anode buried layer 113. The carriers are drawn out from the first cathode electrode 112 and from the first anode electrode 115 as a photocurrent. This photocurrent is subjected to amplification and signal processing performed by electronic circuits composed of the NPN transistor 103 and resistance elements, capacitive elements, etc. that are integrated together on the silicon substrate 101, and then the photocurrent is output so as to become an optical-disc record or reproduction signal.

In the first p-type buried layer 105 that contains a higher concentration of a p-type impurity than the silicon substrate 101, a potential barrier is formed. Since the silicon substrate 101 is not depleted, carriers generated in the silicon substrate 101 move by diffusion, however, due to this potential barrier, those carriers recombine with carriers of opposite signs in the first p-type buried layer 105 and do not reach the p-type epitaxial layer 106. Furthermore, if the impurity concentration in the p-type epitaxial layer 106 is lowered to the point that the p-type epitaxial layer 106 is completely depleted, a drift current, which is a high-speed component, will become dominant in the photocurrent. A diffusion current, which is a low-speed component, will make almost no contribution to the photocurrent, thereby allowing the photodiode 102 to operate at high speed. Moreover, the above-mentioned potential barrier formed by the first p-type buried layer 105 prevents the carriers generated in the silicon substrate 101 from reaching the NPN transistor 103 as well, whereby malfunctions and noise components in the transistor are suppressed.

If the carriers generated in the p-type epitaxial layer 106 serving as the anode reach the NPN transistor 103, those carriers will become a collector current component and thus cause malfunctions and noise components in the circuit. In particular, when light is not sufficiently focused on the photodiode 102 and is incident outwardly (of the photodiode 102), many carriers will be generated in part of the p-type epitaxial layer 106 located in the boundary region between the photodiode 102 and the NPN transistor 103, causing this unfavorable phenomenon to become more predominant.

In contrast, in the optical semiconductor device according to the first conventional example, the light absorbing element 104 is formed between the photodiode 102 and the NPN transistor 103, and a reverse bias is applied between the second cathode electrode 123 and the second anode electrode 124 during operation. Therefore, a photodiode is formed by the cathode layer 110 in the light absorbing element 104 and the p-type epitaxial layer 106 serving as the anode, so that escaping carriers are absorbed in the cathode contact layer 111 and in the anode contact layer 114. If the wires of the second cathode electrode 123 and of the second anode electrode 124 are not connected with the wires of the photodiode 102 and of the NPN transistor 103, unnecessary components are prevented from entering the signal processing section, thereby reduce noise.

Next, an optical semiconductor device according to a second conventional example for suppressing escaping carriers will be described.

FIG. 8 is a cross-sectional view schematically illustrating the structure of the optical semiconductor device of the second conventional example. In this example, a light absorbing element is not provided, and a photodiode 102 has a different structure from that of the first conventional example.

The optical semiconductor device of the second conventional example includes: an n-type buried layer 126 formed on a silicon substrate 101 and containing a high concentration of an n-type impurity; a p-type buried layer 125 formed on the n-type buried layer 126 and containing a high concentration of a p-type impurity; an n-type cathode layer 110 formed on the p-type buried layer 125; an n-type cathode contact layer 111 formed on the cathode layer 110; an anode contact layer 114 formed on the n-type buried layer 126 and containing a high concentration of a p-type impurity; an n-type contact layer 127 formed on the n-type buried layer 126; a first cathode electrode 112 formed on the cathode contact layer 111; a first anode electrode 115 formed on the anode contact layer 114; and a dummy cathode electrode 128 formed on the n-type contact layer 127.

In this structure, a photodiode is formed by the PN junction between an n-type epitaxial layer 107 (the cathode layer 110) and the p-type buried layer 125. In addition, PN junctions are also formed between the p-type buried layer 125 and the n-type buried layer 126 and between the n-type buried layer 126 and the silicon substrate 101.

Moreover, a reverse bias V1 is applied between the first cathode electrode 112 and the first anode electrode 115, and a reverse bias V2 is applied between the dummy cathode electrode 128 and the first anode electrode 115. Therefore, carriers generated by light absorbed by the silicon substrate 101 are absorbed by the dummy photodiode and move through the n-type buried layer 126 and the n-type contact layer 127 to the dummy cathode electrode 128, thus making no contribution to the photocurrent. Consequently, a slow diffusion current component is suppressed, thereby enabling high-speed operation. Also, if the reverse biases are set so as to satisfy V1<V2, it is also possible to suppress carriers that escape from the photodiode 102 to the NPN transistor 103.

SUMMARY OF THE INVENTION

In general, in order to make the light absorbing element 104 completely absorb the carriers escaping from the photodiode 102, the optical semiconductor device of the first conventional example is often used under the condition in which V1<V2 is satisfied. In that case, the part of the p-type epitaxial layer 106 located in the photodiode 102 and in the light absorbing element 104 is completely depleted, and the potential distribution is inclined toward the light absorbing element 104. As a result, carriers generated in part of the p-type epitaxial layer 106 and in part of the n-type epitaxial layer 107 located in the photodiode 2 and in the vicinity of the light absorbing element 104 are drawn toward the light absorbing element 104 and do not contribute to the photocurrent. That is, the component that should contribute to the photocurrent is reduced, causing a problem in that the light receiving sensitivity is decreased. In addition, since the p-type epitaxial layer 106 is a common layer that is also used in the light absorbing element 104 of the photodiode 102, the characteristics of the isolation (separation) between these elements are poor, and leakage current and noise components are increased.

In the optical semiconductor device of the second conventional example, when the NPN transistor 103 is required to respond at high speed, the frequency characteristics degrade due to a reduction in collector resistance, etc., and therefore the thickness of the n-type epitaxial layer 107 cannot be increased very much. In this case, a problem occurs in that the sensitivity to red or infrared light having a long optical absorption length decreases. Also, since the dummy photodiode is connected in parallel with the photodiode 102, the respective junction capacitances between the p-type buried layer 125 and the n-type buried layer 126, between the n-type buried layer 126 and the silicon substrate 101, and between the anode contact layer 114 and the n-type contact layer 127 are added to the photodiode 102 as parasitic capacitances. This causes deterioration in the frequency characteristics that depend on the CR product.

In an optical semiconductor device according to one embodiment of the invention, higher light-receiving sensitivity, faster operating speed, and reduction in noise are all achievable.

An optical semiconductor device in one embodiment of the invention includes: a semiconductor substrate; a light receiving element formed on the semiconductor substrate; a light absorbing element formed on the semiconductor substrate and located adjacent to the light receiving element; and a semiconductor element formed on the semiconductor substrate and used for signal processing. A light absorption region in the light receiving element has a different structure from a light absorption region in the light absorbing element.

It is therefore possible to enhance sensitivity, reduce noise, and increase the operating speed of the semiconductor element and of the light receiving element by individually adjusting the structures of the light absorption regions in the light receiving element and in the light absorbing element.

Specifically, the optical semiconductor device may further include: a first semiconductor layer of a first conductivity type formed over the semiconductor substrate; and a second semiconductor layer of a second conductivity type formed on the first semiconductor layer. The light receiving element may include a part of the first semiconductor layer, a third semiconductor layer composed of a part of the second semiconductor layer and forming a PN junction with the first semiconductor layer, a first cathode contact layer of the second conductivity type formed on the third semiconductor layer and containing impurities in higher concentration than the third semiconductor layer, a fourth semiconductor layer of the first conductivity type formed on the first semiconductor layer, a first anode contact layer of the first conductivity type formed on the fourth semiconductor layer, a first cathode electrode formed on the first cathode contact layer, and a first anode electrode formed on the first anode contact layer; and the light absorbing element may include a part of the first semiconductor layer, a fifth semiconductor layer of the first conductivity type formed on the first semiconductor layer and containing impurities in higher concentration than the first semiconductor layer, a sixth semiconductor layer of the second conductivity type composed of a part of the second semiconductor layer and forming a PN junction with an upper surface of the fifth semiconductor layer, a second cathode contact layer of the second conductivity type formed on the sixth semiconductor layer and containing impurities in higher concentration than the sixth semiconductor layer, a second anode contact layer of the first conductivity type formed on the fifth semiconductor layer, a second cathode electrode formed on the second cathode contact layer, and a second anode electrode formed on the second anode contact layer.

In this structure, since the fifth semiconductor layer, which forms a PN junction with the sixth semiconductor layer, is provided in the light absorbing element, part of the first semiconductor layer located in the lower part of the light absorbing element is not depleted. Consequently, carriers generated in part of the light receiving element located in the vicinity of the light absorbing element do not flow into the light absorbing element, thereby enabling the light receiving sensitivity to be increased. Moreover, potential barriers are formed between the fifth semiconductor layer and the first semiconductor layer and between the fifth semiconductor layer and the part of the second semiconductor layer located in the light receiving element, whereby the light receiving element and the light absorbing element are electrically isolated from each other, and leakage current and noise components are reduced. Furthermore, since the light absorbing element does not become a parasitic capacitance component of the light receiving element, the operating speed of the light receiving element is enhanced.

BRIEF DESCRIPTION OF THE DRAWINGS

FIG. 5 is a cross-sectional view schematically illustrating the structure of an optical semiconductor device according to a second embodiment.

DETAILED DESCRIPTION OF THE INVENTION

First Embodiment

An optical semiconductor device, which is an OEIC, according to a first embodiment of the present invention will be described below with reference to the accompanying drawings.

Figure 1:
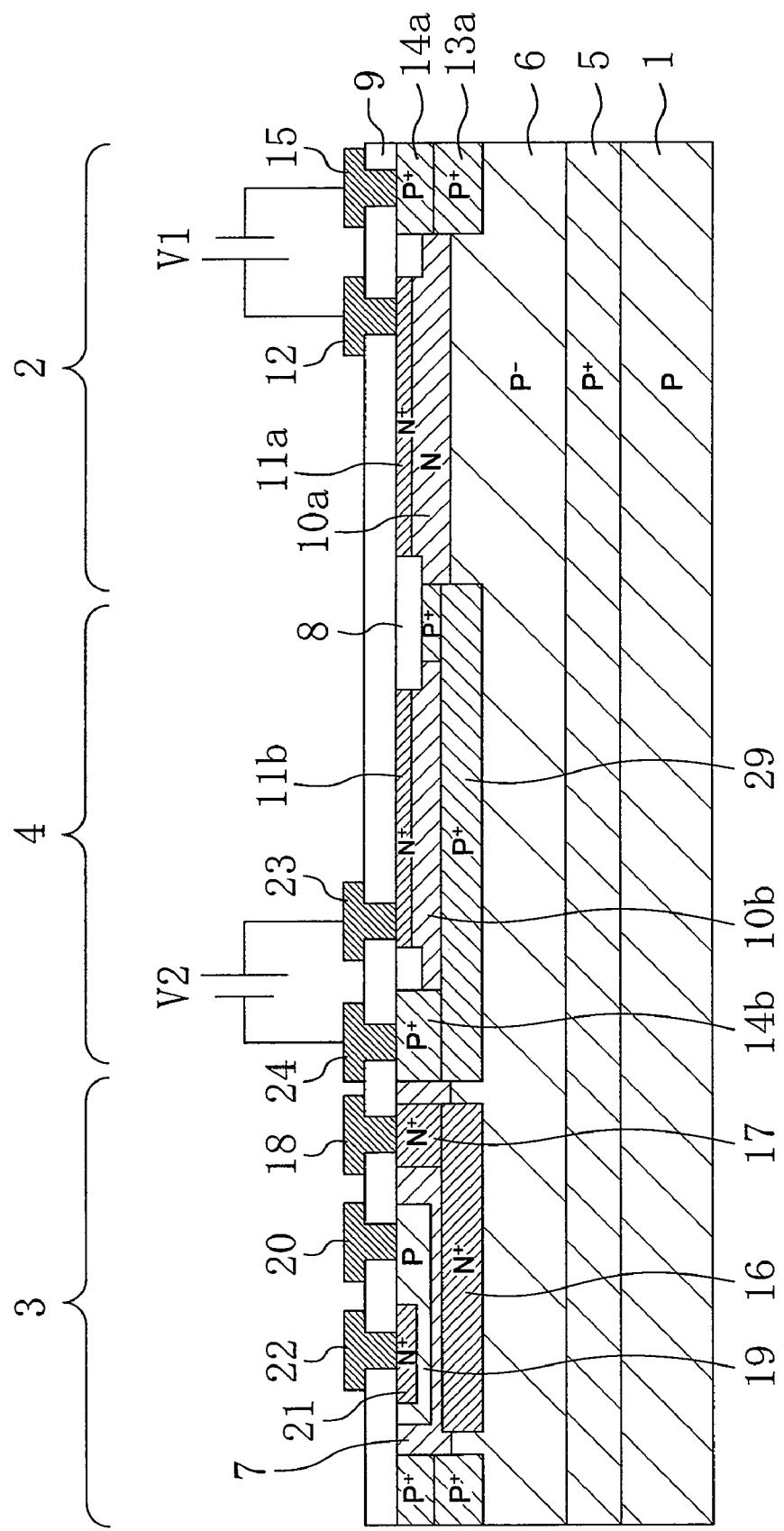
FIG. 1 is a cross-sectional view schematically illustrating the structure of an optical semiconductor device according to a first embodiment.

FIG. 1 is a cross-sectional view schematically illustrating the structure of the optical semiconductor device according to the first embodiment. In FIG. 1, the optical semiconductor device in which a pin photodiode as a light receiving element and an NPN transistor as a bipolar transistor (a semiconductor element) are formed on a p-type silicon substrate is illustrated as an example.

As shown in FIG. 1, the optical semiconductor device according to this embodiment includes: a semiconductor substrate 1 made of silicon, etc. containing a low concentration of a p-type impurity; an NPN transistor 3 formed on the semiconductor substrate 1; a photodiode 2 formed on the semiconductor substrate 1; and a light absorbing element 4 formed in a region on the semiconductor substrate 1 between the NPN transistor 3 and the photodiode 2. The optical semiconductor device of this embodiment also includes: a first p-type buried layer 5 formed on the semiconductor substrate 1 and containing a high concentration of a p-type impurity; a p-type epitaxial layer (a first semiconductor layer) 6 formed on the first p-type buried layer 5 and containing a low concentration of a p-type impurity; an n-type epitaxial layer (a second semiconductor layer) 7 formed on the p-type epitaxial layer 6; a LOCOS isolation layer 8 formed on the n-type epitaxial layer 7 and isolating the light absorbing element 4 and the photodiode 2 from each other; and an insulating film 9 formed on the n-type epitaxial layer 7 and on the LOCOS isolation layer 8.

The photodiode 2 includes: a part of the p-type epitaxial layer 6; an n-type cathode layer (a third semiconductor layer) 10$a$ composed of a part of the n-type epitaxial layer 7; a cathode contact layer 11$a$ formed on the cathode layer 10$a$ and containing a high concentration of an n-type impurity; an anode buried layer (a fourth semiconductor layer) 13$a$ containing a high concentration of a p-type impurity and formed on the p-type epitaxial layer 6; an anode contact layer 14$a$ formed on the anode buried layer 13$a$ and containing a high concentration of a p-type impurity; a first cathode electrode 12 formed on the cathode contact layer 11$a$; and a first anode electrode 15 formed on the anode contact layer 14$a$.

The NPN transistor 3 includes: a collector buried layer 16 formed between the p-type epitaxial layer 6 and the n-type epitaxial layer 7 and containing a high concentration of an n-type impurity; a collector contact layer 17 formed on the collector buried layer 16 and containing a high concentration of an n-type impurity; a p-type base layer 19 formed in a region in the n-type epitaxial layer 7 located above the collector buried layer 16; an emitter layer 21 formed in the base layer 19 and containing a high concentration of an n-type impurity; a collector electrode 18 formed on the collector contact layer 17; a base electrode 20 formed on the base layer 19; and an emitter electrode 22 formed on the emitter layer 21.

The light absorbing element 4 includes: a part of the p-type epitaxial layer 6; a second p-type buried layer (a fifth semiconductor layer) 29 formed on the p-type epitaxial layer 6 and containing a high concentration of a p-type impurity; a cathode layer 10b formed on the second p-type buried layer 29 and composed of a part of the n-type epitaxial layer 7; a cathode contact layer 11b formed on the cathode layer 10b; an anode contact layer 14b formed on the second p-type buried layer 29 and containing a high concentration of a p-type impurity; a second cathode electrode 23 formed on the cathode contact layer 11b; and a second anode electrode 24 formed on the anode contact layer 14b. The optical semiconductor device of this embodiment is characterized in that in the light absorbing element 4, the second p-type buried layer 29 that contains a p-type impurity in higher concentration than the p-type epitaxial layer 6 is formed between the p-type epitaxial layer 6 and the cathode layer 10b. Thus, the location of the PN junction in the light absorbing element 4 is shallower than that of the PN junction in the photodiode 2. The thickness of the second p-type buried layer 29 is from approximately 0.3 μm to approximately 5.0 μm, and the impurity concentration thereof is from approximately $1\times10^{16}$ cm$^{-3}$ to approximately $1\times10^{20}$ cm$^{-3}$.

Operation of the optical semiconductor device of this embodiment thus configured will be described below.

Figure 7:
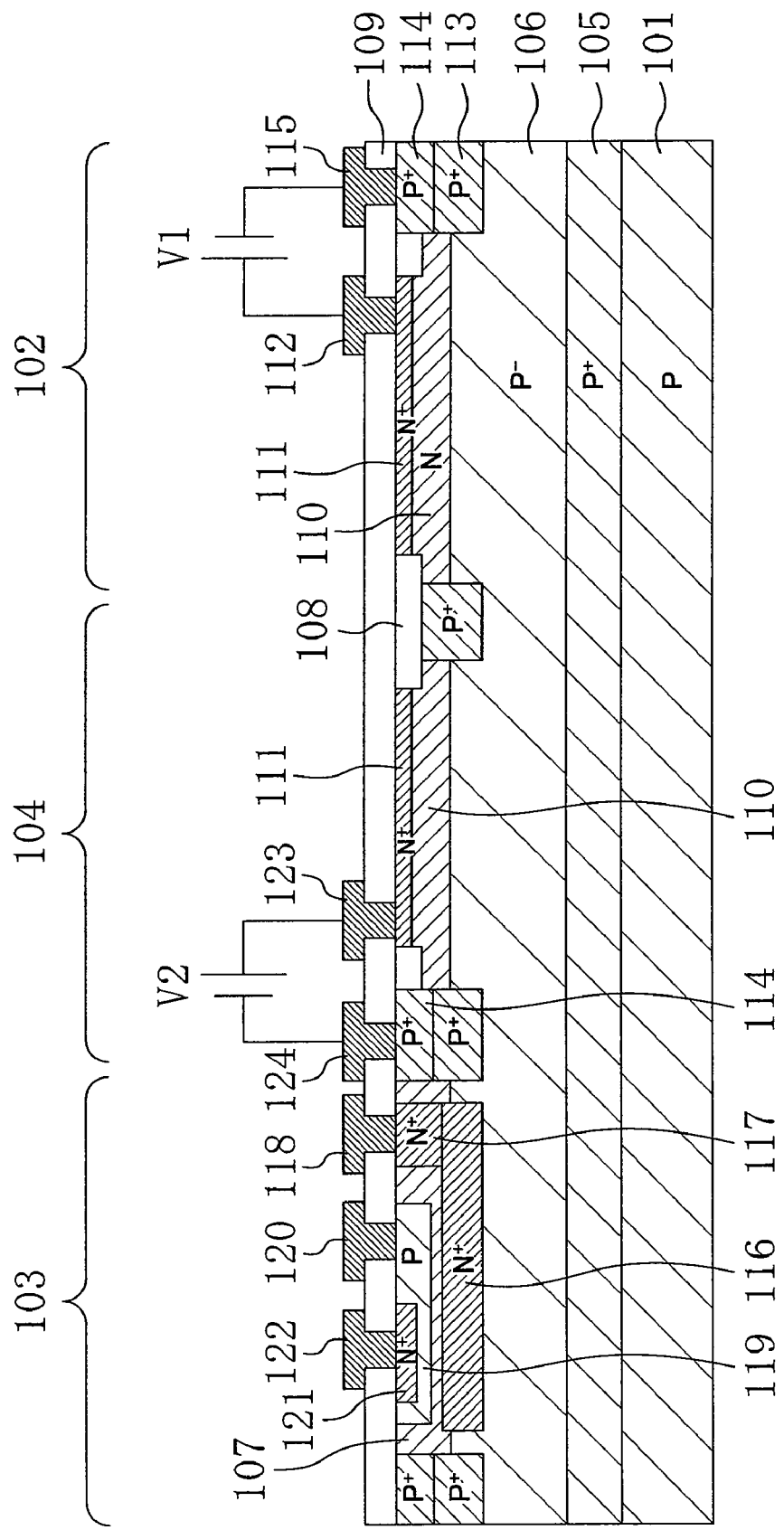
FIG. 7 is a cross-sectional view schematically illustrating the structure of an optical semiconductor device according to a first conventional example.
Figure 8:
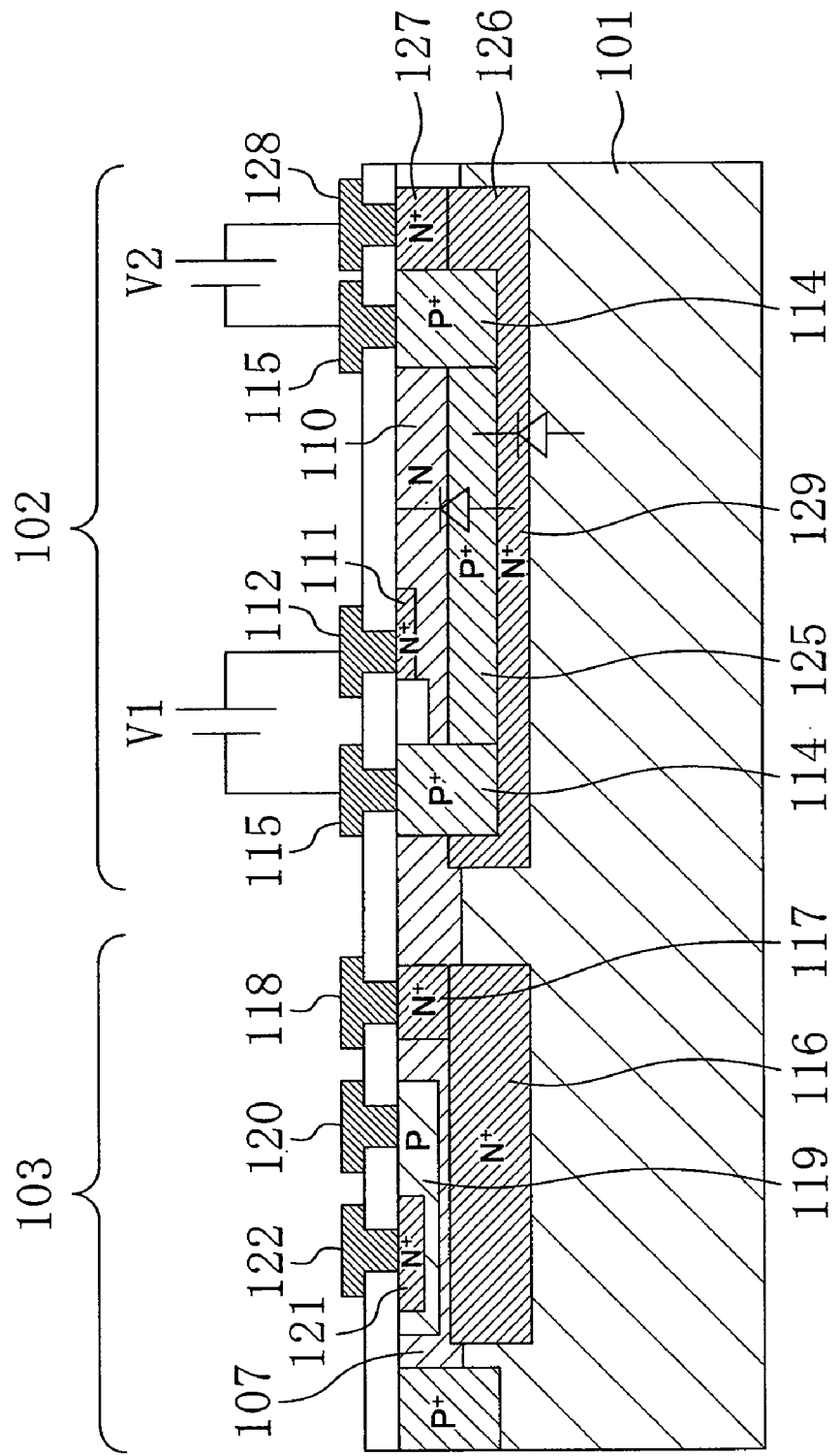
FIG. 8 is a cross-sectional view schematically illustrating the structure of an optical semiconductor device according to a second conventional example.

The basic operation of the optical semiconductor device of this embodiment is the same as that of the first conventional optical semiconductor device shown in FIG. 7. When there is incident light on the photodiode 2 from above, the cathode layer 10a and the p-type epitaxial layer 6 absorb the incident light, thereby generating electron-hole pairs. The electrons reach the first cathode electrode 12 through the cathode contact layer 11a mainly by drift, while the holes reach the first anode electrode 15 through the anode buried layer 13a and the anode contact layer 14a mainly by diffusion. As a result, a photocurrent is generated. For example, when the n-type epitaxial layer 7 has a thickness of approximately 1.0 μm and an impurity concentration of approximately $1\times10^{16}$ cm$^{-3}$, and the p-type epitaxial layer 6 has a thickness of approximately 10 μm and an impurity concentration of approximately $1\times10^{14}$ cm$^{-3}$, a depletion layer in the anode extends about 10 μm, thereby achieving a complete depletion state of the p-type epitaxial layer 6. In particular, in the case of light with a wavelength shorter than 650 nm, which is used in DVDs, most of the incident light is absorbed in the depletion layer (a light absorption region). That is, in the photocurrent, the diffusion current component is reduced, and the drift current component becomes dominant, thereby enabling the photodiode 2 to respond at high speed.

In the light absorbing element 4, the second p-type buried layer 29 is formed between the p-type epitaxial layer 6 and the n-type epitaxial layer 7 (the cathode layer 10b). Thus, the structure of the light absorption region in the photodiode 2 differs from that of the light absorption region in the light absorbing element 4. During operation, a reverse bias V2 is applied between the second anode electrode 24 and the second cathode electrode 23 in the light absorbing element 4, and a reverse bias V1 is applied between the first anode electrode 15 and the first cathode electrode 12 in the photodiode 2. These bias voltages V1 and V2 are set so as to satisfy the condition V2≧V1, for example.

When the optical semiconductor device is operated in the manner described above, the presence of the second p-type buried layer 29 prevents part of the p-type epitaxial layer 6 located in the lower part of the light absorbing element 4 from being depleted, and hence there is no potential gradient toward the light absorbing element 4. Therefore, among the carriers generated in part of the photodiode 2 located in the vicinity of the light absorbing element 4, the holes move through the anode buried layer 13a to the anode contact layer 14a, and the electrons move through the cathode layer 10a only to the cathode contact layer 11a. As a result, the carriers generated by light absorption efficiently contribute as a photocurrent, so that the light receiving sensitivity is increased. In particular, short wavelength light, such as blue light, has a short absorption length, and hence most of the light is absorbed in the second p-type buried layer 29. For example, when the second p-type buried layer 29 has a depth of 1.0 μm, 99.9% of blue light having a wavelength of 405 nm is absorbed by the cathode layer 10a and the cathode contact layer 11a. Consequently, few carriers are generated in the p-type epitaxial layer 6, and thus there are no escaping carriers, allowing the light receiving sensitivity to blue light to be significantly increased as compared to the conventional optical semiconductor devices. It is preferable that the depth of the peak point of the impurity concentration in the second p-type buried layer 29 be deeper than the absorption length of incident light, because the light receiving sensitivity is increased. The "absorption length" herein is a criterion indicating a depth to which light can enter, and is a depth at which the intensity of light satisfies 1/e=37% (in which 63% of the light is absorbed).

Furthermore, since the second p-type buried layer 29 is provided, potential barriers are formed between the second p-type buried layer 29 and the p-type epitaxial layer 6 and between the second p-type buried layer 29 and the cathode layer 10a, whereby the photodiode 2 and the light absorbing element 4 are completely electrically isolated from each other, and the characteristics of the isolation between the light receiving element and the light absorbing element are improved to reduce leakage current and noise components.

Moreover, the light absorbing element 4 is disposed to the side of the photodiode 2, and the anode and cathode of the light absorbing element 4 and those of the photodiode 2 are independent of each other. Therefore, the light absorbing element 4 does not become a parasitic capacitance component that affects the photodiode 2, and a reduction in CR product allows the operating speed of the photodiode 2 to be enhanced.

Figure 2:
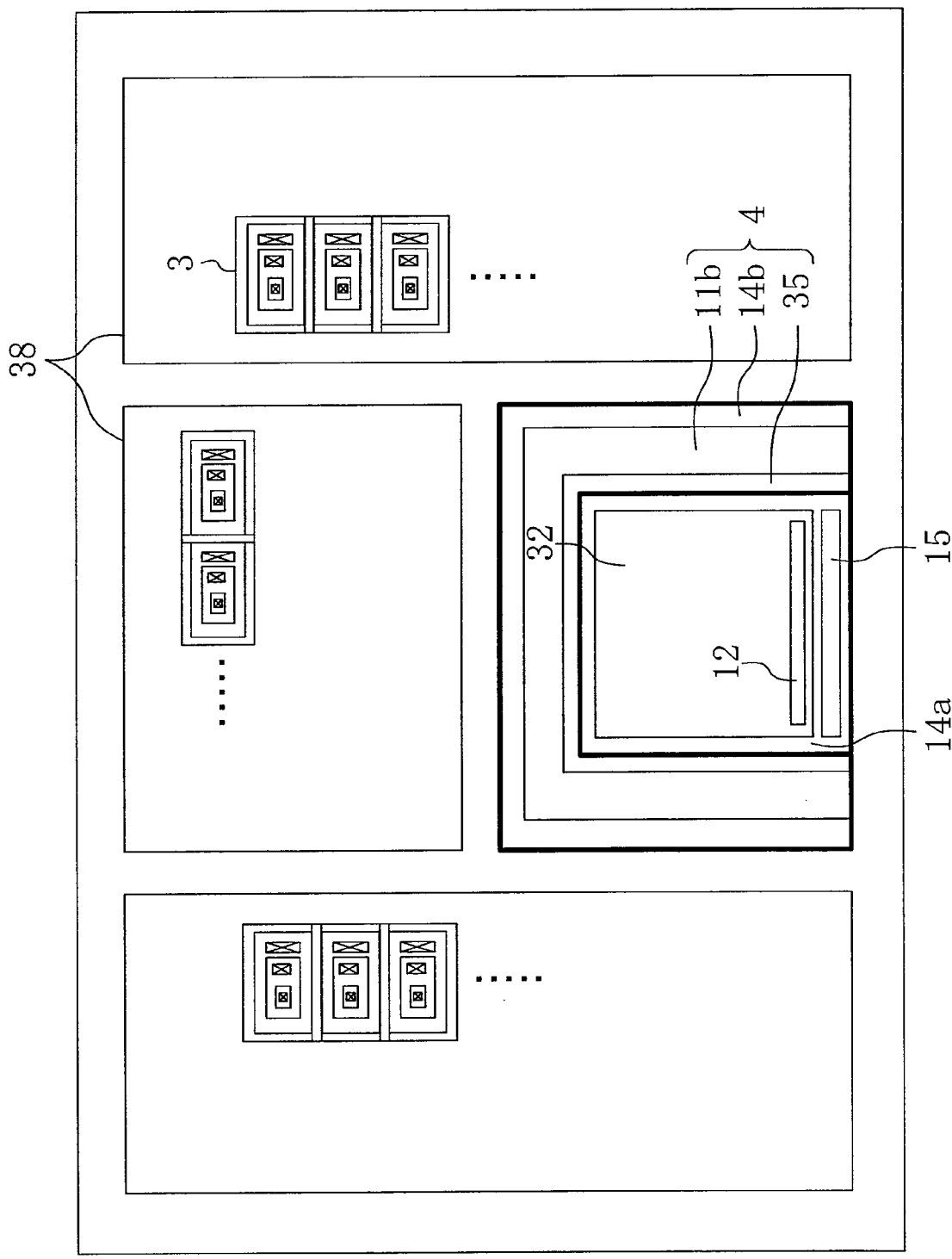
FIG. 2 is a plan view schematically illustrating the optical semiconductor device according to the first embodiment.

Next, the planar configuration of the optical semiconductor device of this embodiment will be also described. FIG. 2 is a plan view schematically illustrating the optical semiconductor device of the first embodiment.

As shown in FIG. 2, in the optical semiconductor device of this embodiment, the first cathode electrode 12 and the first anode electrode 15 are located in the vicinity of the periphery of a light receiving surface 32. In FIG. 2, the illustration of a LOCOS isolation layer between the first cathode electrode 12 and the first anode electrode 15 is omitted.

The light absorbing element 4 is formed so as to surround the photodiode 2. That is, when viewed from above, a dummy anode layer 35 is formed so as to surround the photodiode 2, the cathode contact layer (a dummy cathode layer) 11b is formed so as to surround the dummy anode layer 35, and the anode contact layer (a second dummy anode layer) 14b is formed so as to surround the cathode contact layer 11b. In FIG. 2, the illustration of the second cathode electrode 23 (see FIG. 1) and of the second anode electrode 24 is omitted. Since the light absorbing element 4 is formed so as to surround the photodiode 2, carriers generated by incident light on the peripheral region of the photodiode 2 are absorbed efficiently, so that noise components and hence color mixture are suppressed.

Circuit blocks 38 including NPN transistors 3 are disposed around the photodiode 2 and the light absorbing element 4.

The light receiving surface of the photodiode 2 may be a quadrilateral in which the length of each side is about 10 to about 100 μm, for example, or may be a circle, etc. having a diameter of about 10 to about 100 μm. Also, a split photodiode is often used, in which the light receiving surface 32 is divided into multiple pieces, and a cathode electrode or an anode electrode is formed for each light receiving surface. The width of the light absorbing element 4 is from about several μm to about several tens μm.

Next, a method for fabricating the optical semiconductor device of this embodiment will be described. FIGS. 4A to 4F are cross-sectional views illustrating the method for fabricating the optical semiconductor device of the first embodiment. In the figures, the reference numeral 40 denotes a photodiode formation region, the reference numeral 41 indicates a light absorbing element formation region, and the reference numeral 42 refers to an NPN transistor formation region.

Figure 4A:
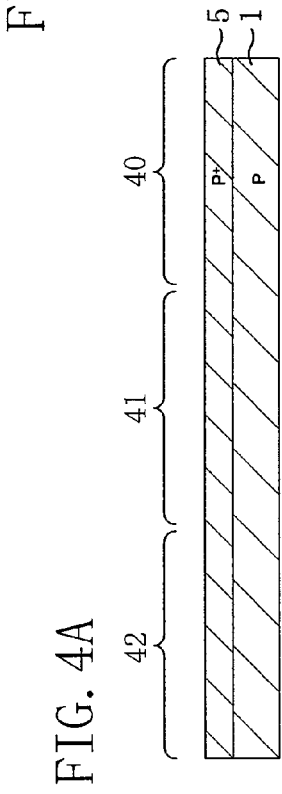
FIGS. 4A to 4F are cross-sectional views illustrating a method for fabricating the optical semiconductor device according to the first embodiment.
Figure 4B:
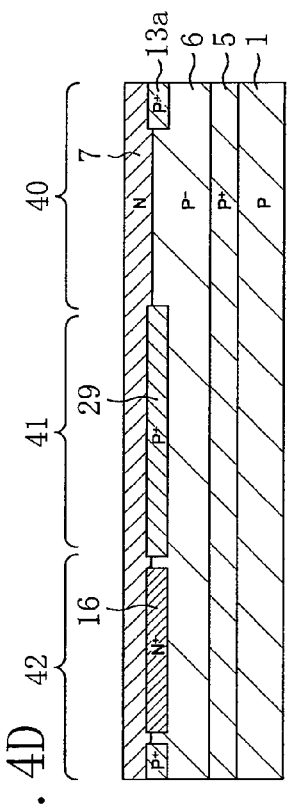

First, as shown in FIG. 4A, ions of a p-type impurity, such as boron (B), are implanted into a semiconductor substrate 1 at a dose of approximately $1 \times 10^{14}$ cm$^{-2}$, for example, thereby forming a first p-type buried layer 5. Next, as shown in FIG. 4B, a p-type epitaxial layer 6 made of a semiconductor having a thickness of 10 μm, for example, and containing a p-type impurity of approximately $1 \times 10^{14}$ cm$^{-3}$ is formed on the first p-type buried layer 5 by a CVD process, etc.

Figure 4C:
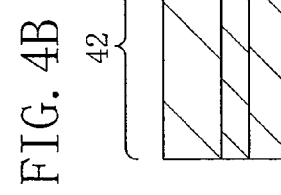

Subsequently, as shown in FIG. 4C, ions of a p-type impurity, such as B, are implanted into the p-type epitaxial layer 6 at a dose of approximately $1 \times 10^{14}$ cm$^{-2}$, for example, thereby forming an anode buried layer 13a in the photodiode formation region 40 and a second p-type buried layer 29 in the light absorbing element formation region 41. And ions of an n-type impurity, such as antimony (Sb), are also implanted into the p-type epitaxial layer 6 at a dose of approximately $1 \times 10^{14}$ cm$^{-2}$, for example, thereby forming a collector buried layer 16 in the NPN transistor formation region 42.

Figure 4D:
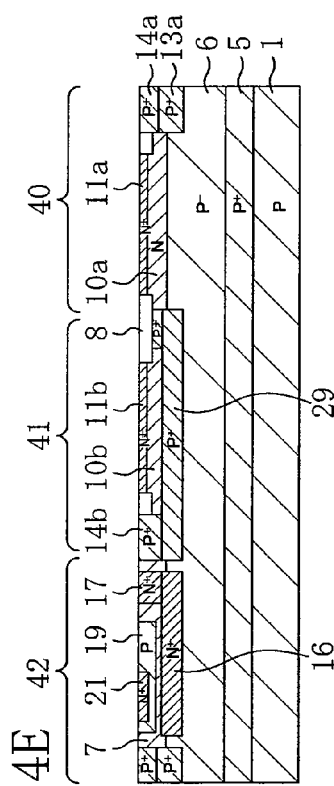

Next, as shown in FIG. 4D, an n-type epitaxial layer 7 made of a semiconductor having a thickness of 1.0 μm, for example, and containing an n-type impurity of approximately $1 \times 10^{16}$ cm$^{-3}$ is formed by a CVD process, etc. on the p-type epitaxial layer 6, the anode buried layer 13a, the second p-type buried layer 29, and the collector buried layer 16.

Figure 4E:
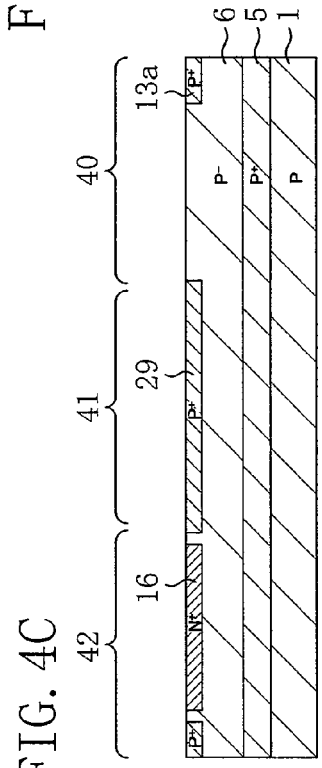
Figure 4F:
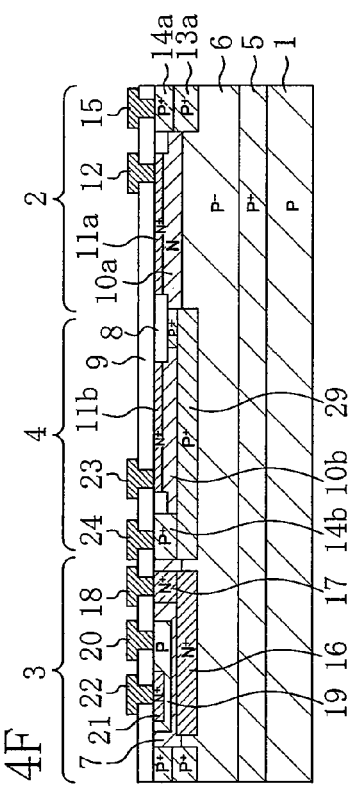

Then, as shown in FIG. 4E, a LOCOS isolation layer 8 is formed by a known method. Thereafter, by ion implantation processes, etc, an n-type cathode contact layer 11a and a p-type anode contact layer 14a are formed in the n-type epitaxial layer 7 in the photodiode formation region 40, and an n-type cathode contact layer 11b, a p-type anode contact layer 14b, and a p-type dummy anode layer 35 are formed in the n-type epitaxial layer 7 in the light absorbing element formation region 41. Also, in the NPN transistor formation region 42, an n-type collector contact layer 17, a p-type base layer 19, an n-type emitter layer 21, etc. are formed.

Next, an insulating film 9 is formed over the optical semiconductor device, and thereafter, a first cathode electrode 12 is formed on the cathode contact layer 11a, a first anode electrode 15 is formed on the anode contact layer 14a, a second cathode electrode 23 is formed on the cathode contact layer 11b, a second anode electrode 24 is formed on the anode contact layer 14b, a base electrode 20 is formed on the base layer 19, and an emitter electrode 22 is formed on the emitter layer 21. In this manner, the optical semiconductor device of this embodiment is fabricated. Since the second p-type buried layer 29 and the anode buried layer 13a can be formed at the same time, the optical semiconductor device of this embodiment can be fabricated through the same number of process steps and by using the same facilities as the conventional optical semiconductor devices. According to the method described above, it is thus possible to provide an optical semiconductor device having high sensitivity and low noise characteristics and capable of high-speed operation without increasing the fabrication cost.

Second Embodiment

An optical semiconductor device according to a second embodiment of the present invention will be described below with reference to the accompanying drawings.

FIG. 5 is a cross-sectional view schematically illustrating the structure of the optical semiconductor device according to the second embodiment. As shown in FIG. 5, the optical semiconductor device of this embodiment is obtained by forming a surface absorption layer 30 on the cathode contact layer 11b in the optical semiconductor device of the first embodiment. In respects other than the surface absorption layer 30, the optical semiconductor device of this embodiment has the same structure as that of the first embodiment.

The surface absorption layer 30 may be made of a material that can absorb incident light, and it is particularly preferable that the surface absorption layer 30 be made of a material, such as polysilicon or amorphous silicon, for example, that has a larger absorption coefficient for visible light than crystalline silicon. Since the absorption coefficient of polysilicon and amorphous silicon for visible light is approximately three to ten times larger than that of crystalline silicon, incident light is greatly absorbed even if the light absorption layer is thin. For example, when the surface absorption layer 30 is made of amorphous silicon, the absorption coefficient for blue light having a wavelength of 405 nm is 70 μm$^{-1}$ (10 μm$^{-1}$ in the case of single crystal silicon). In this case, if the surface absorption layer 30 has a thickness of 20 nm, incident light absorptance is approximately 75%, and if the surface absorption layer 30 has a thickness of 50 nm, incident light absorptance is approximately 97%, which means that most of the light is absorbed by the surface absorption layer 30. Also, the absorption coefficient of amorphous silicon for red light having a wavelength of 650 nm is 1.5 μm$^{-1}$ (0.3 μm$^{-1}$ in the case of single crystal silicon), and if the surface absorption layer 30 has a thickness of 200 nm, incident light absorptance is approximately 26%, and if the surface absorption layer 30 has a thickness of 500 nm, incident light absorptance is approximately 53%, which means that a fair percentage of the light is absorbed. When there is a PN junction formed in the light absorbing element 4, carriers generated by absorbed light are drawn out from the second cathode electrode 23 and do not contribute as a photocurrent for a signal. The formation of the surface absorption layer 30 reduces the percentage of light that enters the cathode contact layer 11b and the second p-type buried layer 29 through the surface absorption layer 30, thereby increasing light absorption efficiency in the light absorbing element 4. If the surface absorption layer 30 is not formed, the thickness of the n-type epitaxial layer 7 must be increased because the absorption coefficient of a silicon crystal for red light and infrared light is small. However, if the n-type epitaxial layer 7 is increased in thickness, the collector resistance in the NPN transistor 3 will be increased, and therefore the thickness of the n-type epitaxial layer 7 cannot be increased very much. In contrast to this, in the optical semiconductor device of this embodiment, the formation of the n-type surface absorption layer 30, for example, ensures an increase in absorption efficiency even if the n-type epitaxial layer 7 is reduced in thickness, so that an improvement in noise characteristics and an increase in the operating speed of the transistor are both achieved. The thickness range of the surface absorption layer 30 varies depending on the material thereof. For example, when the surface absorption layer 30 is made of amorphous silicon, it is desirable that the thickness of the surface absorption layer 30 be from about 100 to about 1000 nm.

Third Embodiment

An optical semiconductor device according to a third embodiment of the present invention will be described below with reference to the accompanying drawings.

Figure 3:
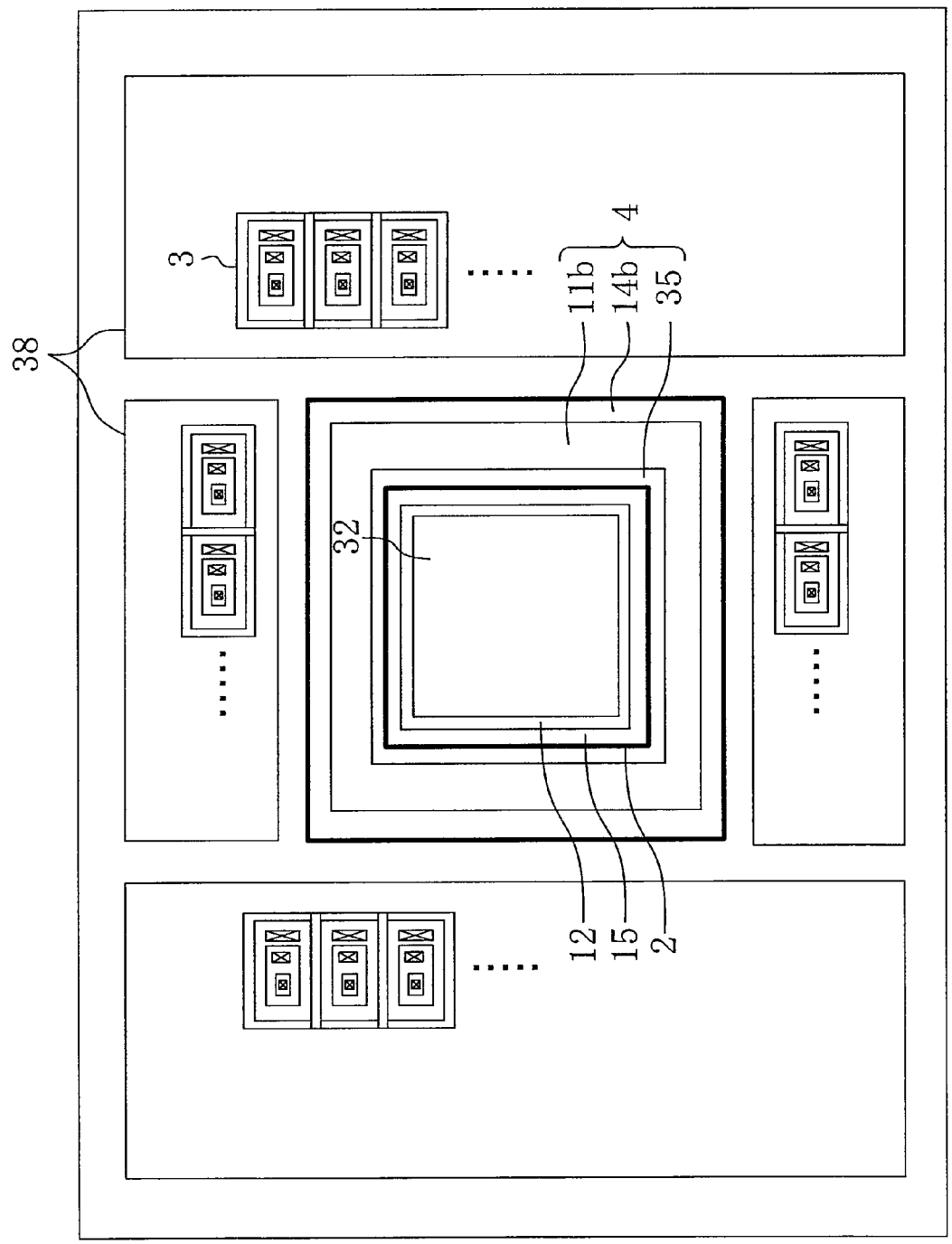
FIG. 3 is a plan view schematically illustrating an optical semiconductor device according to a third embodiment.
Figure 6:
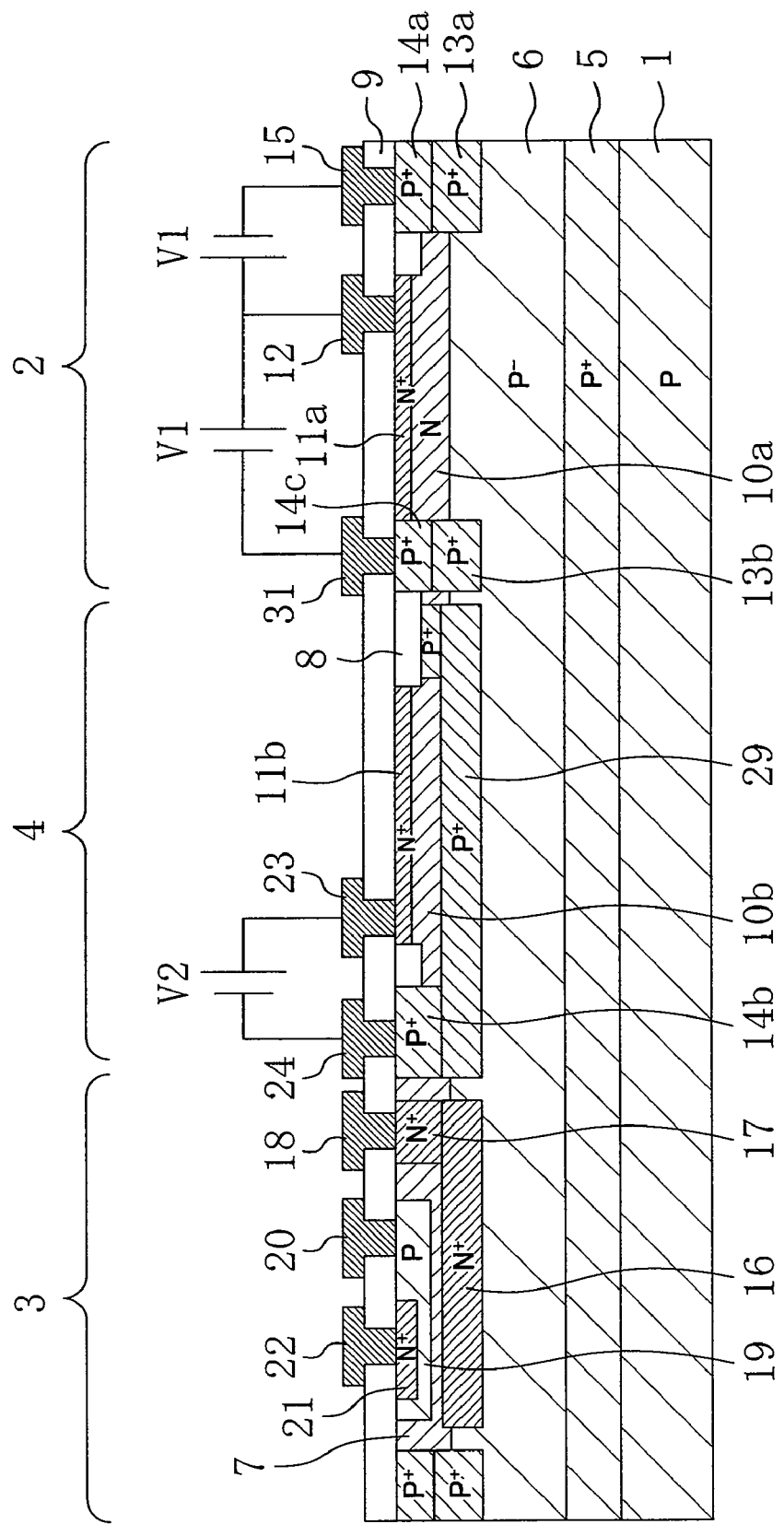
FIG. 6 is a cross-sectional view schematically illustrating the structure of the optical semiconductor device according to the third embodiment.

FIG. 6 is a cross-sectional view schematically illustrating the structure of the optical semiconductor device according to the third embodiment. As shown in FIG. 6, the optical semiconductor device of this embodiment is characterized in that an anode buried layer 13b formed on a p-type epitaxial layer 6 and containing a high concentration of a p-type impurity, an anode contact layer 14c formed on the anode buried layer 13b and containing a high concentration of a p-type impurity, and a third anode electrode 31 formed on the anode contact layer 14c are provided in a region in a photodiode 2 located in the vicinity of a light absorbing element 4. In the other respects, the optical semiconductor device of this embodiment has the same structure as the optical semiconductor device of the first embodiment. FIG. 3 is a plan view schematically illustrating the optical semiconductor device of the third embodiment.

During operation, a reverse bias V1 is applied between a first cathode electrode 12 and the third anode electrode 31, and the reverse bias V1 is applied between the first cathode electrode 12 and a first anode electrode 15.

In the optical semiconductor device of this embodiment, the same effects as those obtainable in the optical semiconductor device of the first embodiment can be achieved, and in addition, since the anode buried layer 13b and the anode contact layer 14c are formed in a region in the photodiode 2 located close to the light absorbing element 4, electric lines of force are centered around the anode buried layer 13b to form a potential gradient. As a result, carriers are drawn into the anode buried layer 13b, and movement of the carriers toward the light absorbing element is suppressed, thereby permitting a further increase in light receiving sensitivity.

Furthermore, the travel distance of carriers generated in the boundary region in the photodiode 2 located in the vicinity of the light absorbing element 4 is significantly reduced, and hence the time during which the carriers move by drift is reduced, so that the photodiode 2 is allowed to operate at higher speed.

Also, in the optical semiconductor device of this embodiment, the anode buried layer 13b can be formed at the same time as an anode buried layer 13a, the anode contact layer 14c can be formed at the same time as anode contact layers 14a and 14b, and the third anode electrode 31 can be formed at the same time as the other electrodes. Therefore, the optical semiconductor device of this embodiment can be fabricated through the same number of process steps as the optical semiconductor device of the first embodiment.

In the optical semiconductor devices according to the foregoing embodiments, a silicon substrate is used as the semiconductor substrate, however, a germanium substrate, which is widely used in the long wavelength region, a substrate made of a compound semiconductor, or a substrate made of material other than a semiconductor, such as a substrate made of sapphire, for example, may also be used instead.

Moreover, in the optical semiconductor devices of the present invention, a pin photodiode is used as the light receiving element, but an avalanche photodiode, a phototransistor, etc. may also be used instead. Also, an NPN transistor is used as the transistor, however, it will easily be appreciated that a PNP transistor or a MOS transistor can also be used instead.

In the foregoing embodiments, the semiconductor substrate and the epitaxial layer formed on the first p-type buried layer 5 are of p-type conductivity but may be of n-type conductivity. In that case, the conductivity types of all layers are reversed.

As described above, the present invention is applicable to the realization of various kinds of devices, such as BD players and recorders, that use OEICs.

The foregoing description illustrates and describes the present disclosure. Additionally, the disclosure shows and describes only the preferred embodiments of the disclosure, but, as mentioned above, it is to be understood that it is capable of changes or modifications within the scope of the concept as expressed herein, commensurate with the above teachings and/or skill or knowledge of the relevant art. The described hereinabove are further intended to explain best modes known of practicing the invention and to enable others skilled in the art to utilize the disclosure in such, or other embodiments and with the various modifications required by the particular applications or uses disclosed herein. Accordingly, the description is not intended to limit the invention to the form disclosed herein. Also it is intended that the appended claims be construed to include alternative embodiments.

What is claimed is:

1. An optical semiconductor device comprising:
    a semiconductor substrate;
    a light receiving element formed on the semiconductor substrate;
    a light absorbing element formed on the semiconductor substrate and located adjacent to the light receiving element;
    a semiconductor element formed on the semiconductor substrate and used for signal processing;
    a first semiconductor layer of a first conductivity type formed over the semiconductor substrate; and
    a second semiconductor layer of a second conductivity type formed on the first semiconductor layer,
    wherein a light absorption region in the light receiving element has a different structure from a light absorption region in the light absorbing element;
    the light receiving element includes a part of the first semiconductor layer, a third semiconductor layer composed of a part of the second semiconductor layer and forming a PN junction with the first semiconductor layer, a first cathode contact layer of the second conductivity type formed on the third semiconductor layer and containing impurities in higher concentration than the third semiconductor layer, a fourth semiconductor layer of the first conductivity type formed on the first semiconductor layer, a first anode contact layer of the first conductivity type formed on the fourth semiconductor layer, a first cathode electrode formed on the first cathode contact layer, and a first anode electrode formed on the first anode contact layer; and
    the light absorbing element includes a part of the first semiconductor layer, a fifth semiconductor layer of the first conductivity type formed on the first semiconductor layer and containing impurities in higher concentration than the first semiconductor layer, a sixth semiconductor layer of the second conductivity type composed of a part of the second semiconductor layer and forming a PN junction with an upper surface of the fifth semiconductor layer, a second cathode contact layer of the second conductivity type formed on the sixth semiconductor layer and containing impurities in higher concentration than the sixth semiconductor layer, a second anode contact layer of the first conductivity type formed on the fifth semiconductor layer, a second cathode electrode formed on the second cathode contact layer, and a second anode electrode formed on the second anode contact layer.

2. The optical semiconductor device of claim 1, wherein the depth of a peak point of the impurity concentration in the fifth semiconductor layer is deeper than absorption length of incident light.

3. The optical semiconductor device of claim 1, wherein during operation, a reverse bias is applied between the first anode electrode and the first cathode electrode, and a reverse bias is applied between the second anode electrode and the second cathode electrode.

4. The optical semiconductor device of claim 3, wherein the reverse bias applied between the second anode electrode and the second cathode electrode is equal to or larger than the reverse bias applied between the first anode electrode and the first cathode electrode.

5. The optical semiconductor device of claim 1, wherein the light absorbing element further includes a light absorption layer for absorbing incident light, the light absorption layer being formed on the second cathode contact layer.

6. The optical semiconductor device of claim 5, wherein the light absorption layer is made of amorphous silicon or polysilicon.

7. The optical semiconductor device of claim 1, wherein the light receiving element further includes a third anode contact layer of the first conductivity type formed in a boundary region between the light receiving element and the light absorbing element located above the first semiconductor layer, and a third anode electrode formed on the third anode contact layer.

8. The optical semiconductor device of claim 7, wherein during operation, a reverse bias is applied between the first anode electrode and the first cathode electrode, and a reverse bias is applied between the third anode electrode and the first cathode electrode.

* * * * *